US009117787B2

(12) United States Patent
Sofer et al.

(10) Patent No.: US 9,117,787 B2
(45) Date of Patent: Aug. 25, 2015

(54) INTEGRATED CIRCUIT DEVICE AND METHOD OF ENABLING THERMAL REGULATION WITHIN AN INTEGRATED CIRCUIT DEVICE

(75) Inventors: Sergey Sofer, Rishon Lezion (IL); Moty Groissman, Beer Sheba (IL); Valery Neiman, Rishon Lezion (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/115,210

(22) PCT Filed: May 27, 2011

(86) PCT No.: PCT/IB2011/052322
§ 371 (c)(1),
(2), (4) Date: Nov. 1, 2013

(87) PCT Pub. No.: WO2012/164340
PCT Pub. Date: Dec. 6, 2012

(65) Prior Publication Data
US 2014/0085758 A1    Mar. 27, 2014

(51) Int. Cl.
*H01L 23/34* (2006.01)
*H01L 23/60* (2006.01)
*H01L 27/02* (2006.01)

(52) U.S. Cl.
CPC .............. *H01L 23/34* (2013.01); *H01L 23/60* (2013.01); *H01L 27/0248* (2013.01); *H01L 2924/0002* (2013.01)

(58) Field of Classification Search
CPC ...... H01L 23/60; H01L 23/34; H01L 27/0248
See application file for complete search history.

(56) References Cited

U.S. PATENT DOCUMENTS

| 5,440,520 A | 8/1995 | Schutz et al. | |
|---|---|---|---|
| 6,600,356 B1 * | 7/2003 | Weiss | 327/310 |
| 6,815,643 B2 | 11/2004 | Der Ropp | |
| 6,946,707 B2 * | 9/2005 | Voldman | 257/355 |
| 7,773,446 B2 * | 8/2010 | Thorp et al. | 365/211 |
| 2004/0094529 A1 * | 5/2004 | Richter | 219/202 |
| 2006/0090541 A1 | 5/2006 | Theil | |
| 2007/0200608 A1 | 8/2007 | Fang et al. | |
| 2009/0003109 A1 | 1/2009 | Thorp et al. | |
| 2011/0140623 A1 * | 6/2011 | Felty et al. | 315/246 |

OTHER PUBLICATIONS

International Search Report and Written Opinion correlating to PCT/IB2011/052322 dated Dec. 27, 2011.

* cited by examiner

*Primary Examiner* — Zeev V Kitov

(57) ABSTRACT

An integrated circuit device comprising at least one electrostatic discharge (ESD) clamp device. The at least one ESD clamp device comprises a first channel input, a second channel input, and a control input arranged to receive a control signal. The at least one ESD clamp device is arranged to selectively operate in a conductive state in which the at least one ESD clamp device permits current to flow between the first and second channel inputs thereof based at least partly on the received control signal. The integrated circuit device further comprises at least one biasing module. The at least one biasing module comprises at least one output operably coupled to the control input of the at least one ESD clamp device, and at least one input arranged to receive a thermal regulation signal. The at least one biasing module being arranged to apply a bias to the control signal for the at least one ESD clamp device based at least partly on the received thermal regulation signal.

12 Claims, 1 Drawing Sheet

INTEGRATED CIRCUIT DEVICE AND METHOD OF ENABLING THERMAL REGULATION WITHIN AN INTEGRATED CIRCUIT DEVICE

FIELD OF THE INVENTION

The field of this invention relates to an integrated circuit device and a method of enabling thermal regulation within an integrated circuit device.

BACKGROUND OF THE INVENTION

Modern integrated circuit device technology exhibits a temperature inversion effect whereby electrical signal paths are 'slower' at cold temperatures than at hot temperatures due to a combination of various MOSFET (metal oxide semiconductor field effect transistor) parameters. In particular, the conjunction of the following parameters, which influence the switching delay within MOSFET devices in different ways, generally contributes to such temperature inversion effects:
  Charge carrier mobility (which is a function of $T^{-2}$, the inverse square of the temperature, at gate bias corresponding to strong inversion);
  Threshold voltage (Vth) (which is a function of $T^{-1}$, the inverse temperature); and
  Sub-threshold or leakage current (a function of T);
where T represents the temperature.
Thus, the characteristics of an integrated circuit device are, at least partly, dependent on the temperature. During the conception of the integrated circuit device, the range of operating temperatures therefore has to be taken into account and the broader the operating temperature range the wider the variation in characteristics to be dealt with.

The operating temperature is not solely determine by the ambient temperature of the integrated circuit device since normal integrated circuit (IC) device operation causes device 'self-heating', i.e. the temperature of the device increases due to the thermal energy released during operation, to a temperature T above the ambient temperature $T_{amb}$, absent compensating cooling effects that is. Such self-heating during normal IC operation allows the junction temperature operating range for which an integrated circuit device is designed to be reduced. As a result, faster and easier design closure for the integrated circuit may be achieved. However, during a 'low power' period or at start-up of the integrated circuit device, the self-heating capabilities of the integrated circuit device may not be sufficient to be relied upon, e.g. the thermal energy released may not be sufficient to compensate for the loss of thermal energy to the surroundings or the device leading to cooling or the device may not have heated up.

SUMMARY OF THE INVENTION

The present invention provides an integrated circuit device and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
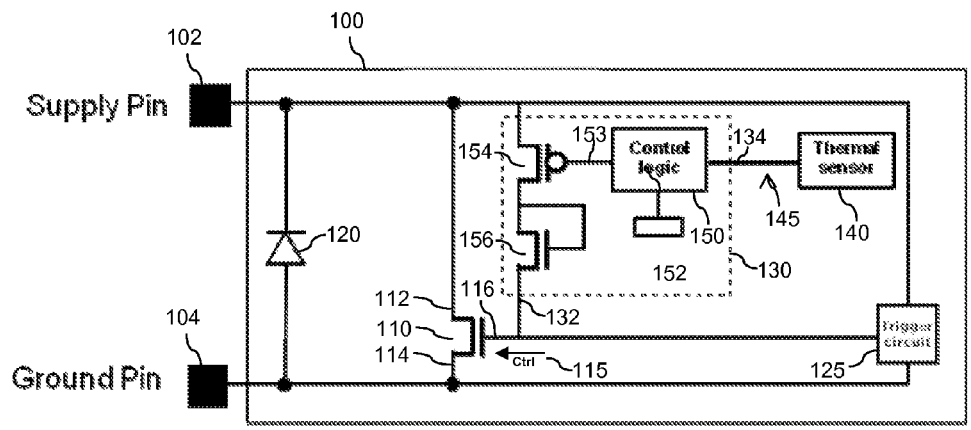
FIG. 1 shows a simplified block diagram of an example of an integrated circuit device.

An example of the present invention will now be described with reference to a simplified example of an integrated circuit device within which aspects of the present invention may be implemented. It will be appreciated that the present invention is not limited to the specific implementation illustrated in the drawings, and the simplified illustrated example is only intended to provide an aid to understanding the inventive concept. For example, for the illustrated example the integrated circuit device is illustrated as comprising a single electrostatic discharge (ESD) clamp device. However, as will be appreciated by a skilled artisan, an integrated circuit device may comprise any number of ESD clamp devices, and typically a plurality of such ESD clamp devices. Furthermore, whilst for the illustrated example the ESD clamp device comprises metal oxide field effect transistor (MOSFET), it will be appreciated that the present invention is not limited to being implemented with such an ESD clamp device. The present invention may equally be applied to alternative implementations of ESD clamp devices capable of being arranged to selectively operate in an at least partially conductive state, such as bipolar transistors or other clamp devices.

Furthermore, because the illustrated embodiments of the present invention may for the most part, be implemented using electronic components and circuits known to those skilled in the art, details will not be explained in any greater extent than that considered necessary, as illustrated below, for the understanding and appreciation of the underlying concepts of the present invention and in order not to obfuscate or distract from the teachings of the present invention.

Referring first to FIG. 1, there is illustrated a simplified block diagram of an example of an integrated circuit (IC) device 100 comprising at least one electrostatic discharge (ESD) clamp device 110. In the illustrated example, the ESD clamp device 110 comprises a metal oxide semiconductor field effect transistor (MOSFET), and comprises a first channel input 112 operably coupled to a first external contact 102 of the integrated circuit device 100 and a second channel input 114 operably coupled to a second external contact 104 of the integrated circuit device 100. In the illustrated example, the first external contact 102 comprises a voltage supply pin, and the second external contact 104 comprises a ground pin. The ESD clamp device 110 further comprises a control input 116 arranged to receive a control signal 115, and is arranged to selectively operate in a conductive state in which the ESD clamp device 110 permits current to flow between the first and second channel inputs 112, 114 thereof, based at least partly on the received control signal 115.

ESD clamp devices, such as the ESD clamp device 110, are typically provided within integrated circuit devices to protect components of the integrated circuit devices from large current surges, etc., occurring on external contacts caused by electrostatic discharges or the like. To this end, the integrated circuit device 100 further comprises a trigger circuit 125 arranged to detect such a current surge, and to cause the ESD clamp device 110 to operate in a conductive state to permit the current surge to dissipate there through upon detection of the current surge. In this manner, the trigger circuit 125 and the clamp 110 as the ESD protection solution provide protection to functional components (not shown) of the integrated circuit device 100.

The integrated circuit device 100 of FIG. 1 further comprises at least one biasing module 130. The at least one biasing module 130 comprises at least one output 132 operably coupled to the control input 116 of the at least one ESD clamp device 110. The at least one biasing module 130 further comprises at least one input 134 arranged to receive a thermal regulation signal 145. The biasing module 130 is arranged to apply a bias to the control signal 115 for the at least one ESD clamp device 110 based at least partly on the received thermal regulation signal (145).

In this manner, the biasing module 130 may be arranged to cause the at least one ESD clamp device 110 to operate in an at least partially conductive state, for example by overriding at least partially the control of the trigger circuit 125, such that current flows there through. Accordingly, current flows from, in the case of the illustrated example, the supply pin 102 to the ground pin 104. However, the current may flow though other parts of the integrated circuit device 100, for example through the ESD clamp device 110 and associated interconnection lines, such as supply and ground lines connecting supply pin 102 and the ESD clamp input 112 and ground pin 104 and ESD clamp output 114. The current will result in at least some heating up of the ESD clamp device 110 and the interconnection lines. As a result, by causing such current flow to take place, the junction temperature for functional components (not shown) of the integrated circuit device 100 may be increased, for example in order to raise the junction temperature of the integrated circuit device to within a desired junction temperature operating range therefor, e.g. to be above a lower limit of a predefined operating temperature range with a lower limit $T_{min}$ and an upper limit $T_{max}$.

In the example illustrated in FIG. 1, the thermal regulation signal 145 comprises an indication of a junction temperature for the integrated circuit device 100. In this manner, the biasing module 130 may be arranged to cause the at least one ESD clamp device 110 to operate in an at least partially conductive state based at least partially on the received indication of a junction temperature for the integrated circuit device 100.

In some examples, the biasing module 130 may be arranged to apply a bias to the control signal 115 for the at least one ESD clamp device 110 to cause the ESD clamp device 110 to operate in an at least partially conductive state upon an indicated junction temperature 145 for the integrated circuit device 100 being less than a threshold value.

In this manner, when the indicated junction temperature 145 is determined as being below the threshold value $T_{TH}$, such as may be the case when the integrated circuit device 100 is initially powered up or during periods of low power consumption for the integrated circuit device 100, the biasing module 130 is arranged to cause the at least one ESD clamp device 110 to operate in an at least partially conductive state, such that current is able to flow there through. Thus, in this manner, during such periods of indicated low temperature, current is able to, and when properly connected to a power supply and ground does, flow from, in the case of the illustrated example, the supply pin 102 to the ground pin 104. The current flow will generate thermal energy and hence, (unless there is a loss of thermal energy, due to e.g. a cooling system), the current flow through the ESD clamp device 110 will result in at least some heating up of the ESD clamp device 110, and this heat will spread through the other parts of the integrated circuit 100, especially in case the ESD claim device 110 is on the same die as the other parts. As a result, by causing such current flow to take place during periods of low temperature, the junction temperature for functional components (not shown) of the integrated circuit device 100 may be increased, for example in order to raise the junction temperature of the integrated circuit device to within a desired junction temperature operating range therefor.

Significantly, by utilising ESD clamp devices, additional heading elements are not required to be included within the integrated circuit device 100. As a result, no significant real estate overhead is required to provide the heating effect during periods of low temperature, such as may be the case when the integrated circuit device 100 is initially powered up or during periods of low power consumption for the integrated circuit device 100.

The current may be enabled, and hence heating may be applied at any suitable point in time. For example, the heating may for example be applied during the power-up of the integrated circuit device, or during exiting from a low power period. Thereby, the impact on the functioning of other parts of the integrated circuit may be reduced, or completely avoided. For example, in some examples, operation during normal device functioning may cause a power supply voltage sag due to the high current draw from the voltage supply pin 102. As a result, sensitive integrated circuit device modules may malfunction, and an unacceptably high power consumption may occur.

Junction Temperature Operating Range

In some examples, the threshold value may be configured to correspond to, or be representative of, a minimum temperature value for an junction temperature operating range of the integrated circuit device 100. In this manner, the biasing module 130 may be arranged to cause current to flow through the ESD clamp device 110 when the indicated temperature drops below the minimum temperature value for the junction temperature operating range of the integrated circuit device 100.

Alternatively, the threshold value may be configured to be substantially representative of a temperature greater than the minimum operating temperature value $T_{min}$, e.g. be above by a tolerance margin $\Delta T_{min}$. In this manner, the biasing module 130 may be arranged to cause current to flow through the ESD clamp device 110 before the indicated temperature drops below the minimum temperature value $T_{min}$ for the junction temperature operating range of the integrated circuit device 100.

Thus, by causing current to flow through the ESD clamp device 110 in this manner, the junction temperature for the functional components (not shown) of the integrated circuit device may be substantially maintained within the junction temperature operating range of the integrated circuit device 100.

The biasing module 130 may be arranged to apply a bias to the control signal 115 for the ESD clamp device 110 to cause the ESD clamp device 110 to operate in a pinch-off mode, in which moderated current flow is permitted between the first and second channel input 112, 114 thereof, upon an indicated junction temperature 145 for the integrated circuit device 100 being less than a threshold value. In this manner, by causing moderated current flow through the ESD clamp device 110, i.e. by maintaining at least some resistance between the first and second channel input 112, 114 of the ESD clamp device 110, the amount of thermal energy released by the current flow will be increased.

In the illustrated example, the biasing module 130 comprises a control module 150 that is arranged to receive the indication 145 of a junction temperature T for the integrated circuit device 100, and compare the received indication 145 to a threshold value $T_{TH}$. The control module 150, is further arranged to cause a bias to be applied to the control signal 115 for the at least one ESD clamp device 110 to cause the ESD clamp device 110 to operate in an at least partially conductive state, upon the indicated junction temperature 145 for the integrated circuit device 100 being less than the threshold value.

In particular for the illustrated example, the control module 150 is operably coupled to a memory element 152 and arranged to retrieve the threshold value $T_{TH}$ with which the received indication 145 of a junction temperature is compared from the memory element 152. In some examples, the memory element 152 may comprise a programmable memory element, such as a programmable register or the like. For example, the memory element 152 may comprise fuse-based coding. In this manner, the threshold value $T_{TH}$ may be configured post-fabrication of the integrated circuit device 100.

In the illustrated example, the biasing module 130 comprises a switching element comprising a first MOSFET 154. The first MOSFET 154 is coupled with its source node to the common supply net, which in the illustrated example comprises the voltage supply pin 102. The first MOSFET 154 is further coupled with its drain node to a second MOSFET 156, having a diode-like connection and serving as a diode element. In this manner, the first MOSFET 154 is arranged to selectively couple the second MOSFET 156 to the voltage supply 102. An anode (+) of the second MOSFET 156 is coupled to the drain of the first (switch) MOSFET 154. A cathode (−) of the second MOSFET 156 is coupled to the output 132 of the biasing module 130.

The control module 150 is operably coupled to a gate node of the first MOSFET 154, operating as a switching element, and is arranged to provide a control signal 153 to the first MOSFET 154 based at least partly on the received thermal regulation signal 145. In this manner, the first MOSFET 154 enables pulling up of the output voltage 132 of the biasing module 130 when the enabling signal (with inverse polarity in the example of FIG. 1) is received from the control module 150.

Thus, when the first (switch) MOSFET 154 receives an enabling signal from the control module 150, the anode of the second (diode) MOSFET 156 is coupled to the voltage supply pin 102. As a result, a voltage that is approximately equal to the voltage supply pin 102 (VDD), less the threshold voltage of the second (diode) MOSFET 156 (VTHdiode), is provided to the output voltage 132 of the biasing module 130. This output voltage 132 is applied between the source and the drain nodes (channel inputs 112, 114) of the ESD clamp transistor 110, thereby enabling current flow through the ESD clamp transistor 110. Specifically, the output voltage 132 of the biasing module 130 is significantly lower than the supply voltage (VDD), and as such will enable a moderated current flow through the ESD clamp transistor 110, substantially avoiding too great a current demand on an external power supply (not shown).

In the illustrated example, the biasing module 130 comprises a small clamp gate biasing circuit and simple control module. As a result, the additional real estate required for such a biasing circuit is only small.

In the illustrated example, the indication 145 of a junction temperature is provided by a thermal sensor 140, for example comprising a thermal diode or the like. The thermal sensor 140 has been illustrated as comprising a functional unit to the biasing module 130. However, in some examples, the thermal sensor 140 may be equally incorporated within the biasing module 130, with the indication of a junction temperature comprising a temperature detected by the incorporated thermal sensor.

Thus, an integrated circuit device 100 has been described comprising at least one ESD clamp device and at least one biasing module that are arranged to cause a heating effect within the integrated circuit device 100 when an indicated temperature is below a threshold value. In this manner, an improved technique of providing heating within the integrated circuit device 100 during periods of low temperature, such as when the integrated circuit device 100 is initially powered up or during periods of low power consumption for the integrated circuit device 100, is provided. Examples utilise existing ESD clamp devices within the integrated circuit device 110, thereby enabling the junction temperature of the integrated circuit device to be maintained within an junction temperature operating range therefor without a need for significant additional heating elements to be included within the integrated circuit device. As a result, a shorter junction temperature operating range for the integrated circuit device 100 may be implemented without significant additional real estate overhead requirements, thereby decreasing the design complexity and enabling a faster and easier design closure for the integrated circuit device 100 to be achieved.

Figure 2:
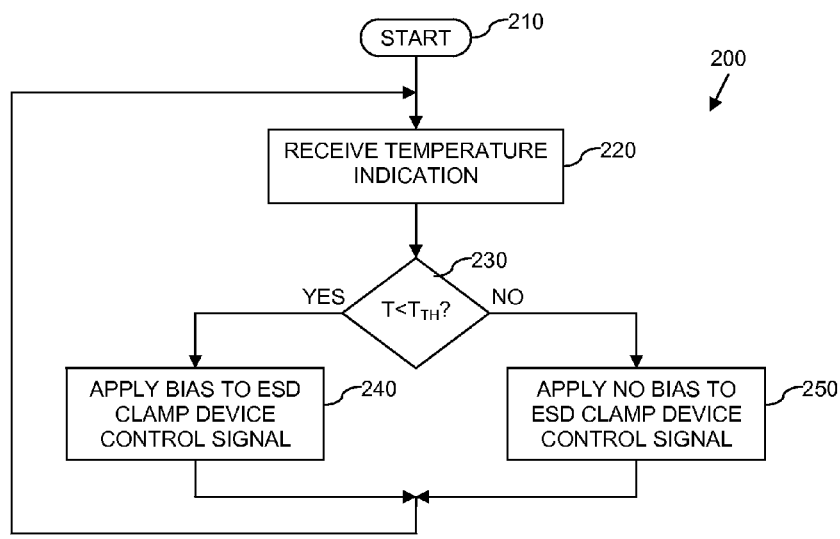
FIG. 2 shows a simplified flowchart of an example of a method of enabling self-heating within an integrated circuit device.

Referring to FIG. 2, there is illustrated a simplified flowchart 200 of an example of a method of enabling self-heating within an integrated circuit device. The method starts at 210, for example with a powering up of the integrated circuit device, and moves on to 220 where a thermal regulation signal, which for the illustrated example comprises an indication of a junction temperature T for the integrated circuit device, is received or obtained. The received indication is then compared with a threshold value $T_{TH}$, at 230. If the received indication is below the threshold value, $T > T_{Th}$, the method moves on to 240, where a bias is applied to a control signal for at least one ESD clamp device of the integrated circuit device to cause the at least one ESD clamp device to operate in an at least partially conductive state. The method then loops back to 220. Conversely, if the received indication is above the threshold value, the method moves on to 250, where no such bias is applied to the control signal for the at least one ESD clamp device.

In the foregoing specification, the invention has been described with reference to specific examples of embodiments of the invention. It will, however, be evident that various modifications and changes may be made therein without departing from the broader scope of the appended claims, which thus are not limited to the specific examples shown.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, for clarity, the biasing module 130 has been illustrated and herein described as comprising a separate function entity to the ESD trigger circuit 125. However, in some examples, at least parts of the biasing module 130 may be integrated within the trigger circuit 125.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, and as illustrated in FIG. 1, the thermal regulation signal 145 may originate (e.g. be generated) within the same integrated circuit device as the biasing module 130. Alternatively, the examples may be implemented as any number of separate integrated circuits or separate devices interconnected with each other in a suitable manner. For example, in other example embodiments, the thermal regulation signal 145 may originate within a different integrated circuit device or different discrete device. Furthermore, the integrated circuit device may comprises one or more dies on which electronic circuits, such as logic circuits and/or analog circuits are provided, and which are packaged in the same package. The shown examples may e.g. be implemented on the same die or on different dies. For instance, two or more, such as all, of the ESD clamp device 110, biasing module 130, control module 150, thermal sensor 140, trigger circuit 125 may be provided on the same die.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit device, comprising:
   at least one electrostatic discharge, ESD, clamp device; the
     at least one ESD clamp device comprising:
       a first channel input;
       a second channel input; and
       a control input arranged to receive a control signal,
     the at least one ESD clamp device being arranged to selectively operate in a conductive state in which the at least one ESD clamp device permits current to flow between the first and second channel inputs thereof based, at least partly, on the received control signal;
   at least one biasing module comprising:
     at least one output operably coupled to the control input of the at least one ESD clamp device; and
     at least one input arranged to receive a thermal regulation signal,
   the at least one biasing module being arranged to apply a bias to the control signal for the at least one ESD clamp device based at least partly on the received thermal regulation signal.

2. The integrated circuit device of claim 1, wherein the thermal regulation signal comprises an indication of a junction temperature for the integrated circuit device.

3. The integrated circuit device of claim 2, wherein the at least one biasing module is arranged to apply a bias to the control signal for the at least one ESD clamp device to cause the ESD clamp device to operate in an at least partially conductive state, upon an indicated junction temperature for the integrated circuit device being less than a threshold value.

4. The integrated circuit device of claim 3, wherein the at least one biasing module is arranged to apply a bias to the control signal for the at least one ESD clamp device to cause the ESD clamp device to operate in a pinch-off mode in which moderated current flow is permitted between the first and second channel input thereof, upon an indicated junction temperature for the integrated circuit device being less than a threshold value.

5. The integrated circuit device of claim 2, wherein the at least one biasing module further comprises a control module arranged to:
   receive an indication of a junction temperature for the integrated circuit device;
   compare the received indication to a threshold value; and
   cause a bias to be applied to the control signal for the at least one ESD clamp device based at least partly on the received indication of the junction temperature for the integrated circuit device.

6. The integrated circuit device of claim 5, wherein the control module is operably coupled to a programmable memory element and arranged to retrieve the threshold value with which the received indication of a junction temperature is compared from the programmable memory element.

7. The integrated circuit device of claim 5, wherein the control module further comprises a switching element arranged to selectively couple an anode of a diode element to a common supply net in accordance with a control signal received from the control module.

8. The integrated circuit device of claim 7, further comprising a cathode of the diode element being coupled to the output of the biasing module.

9. The integrated circuit device of claim 1, wherein the ESD clamp device comprises a metal oxide semiconductor field effect transistor.

10. The integrated circuit device of claim 1, wherein the threshold value is configured to correspond to a minimum temperature value for a junction temperature operating range of the integrated circuit device.

11. The integrated circuit device of claim 1, wherein the first channel input of the ESD clamp device is operably coupled to a first external contact of the integrated circuit device, and the second channel input of the ESD clamp device is operably coupled to a second external contact of the integrated circuit device.

12. A method of thermal regulation within an integrated circuit device, the method comprising:
   receiving a thermal regulation signal; and applying a bias to a control signal for at least one electrostatic discharge, ESD, clamp device based at least partly on the received thermal regulation signal, which causes the at least one ESD clamp device permits current to flow between first and second channel inputs of the ESD clamp device.

* * * * *